United States Patent
Kim et al.

(10) Patent No.: US 8,610,184 B2
(45) Date of Patent: Dec. 17, 2013

(54) SEMICONDUCTOR INTEGRATED CIRCUIT DEVICE

(75) Inventors: Hyeon-Cheol Kim, Yougin-si (KR); Eun-Jeong Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 221 days.

(21) Appl. No.: 13/051,246

(22) Filed: Mar. 18, 2011

(65) Prior Publication Data

US 2011/0260798 A1    Oct. 27, 2011

(30) Foreign Application Priority Data

Apr. 22, 2010   (KR) .................. 10-2010-0037547

(51) Int. Cl.
*H01L 29/76*   (2006.01)
(52) U.S. Cl.
USPC ........... 257/288; 330/251; 330/257; 257/561; 257/368; 257/355; 257/369; 257/207
(58) Field of Classification Search
USPC .......... 257/288, 368, 355, 369, 207; 330/251, 330/257; 327/561
See application file for complete search history.

(56) References Cited

U.S. PATENT DOCUMENTS

| | | | |
|---|---|---|---|
| 5,517,149 A * | 5/1996 | Ganesan et al. | 327/363 |
| 5,677,867 A * | 10/1997 | Hazani | 365/185.01 |
| 5,814,845 A * | 9/1998 | Carley | 257/207 |
| 5,859,457 A * | 1/1999 | Thiel et al. | 257/335 |
| 6,545,538 B1 * | 4/2003 | Ivanov et al. | 330/255 |
| 6,989,572 B2 * | 1/2006 | Stefanov et al. | 257/355 |
| 2001/0002100 A1 * | 5/2001 | Compton et al. | 320/165 |
| 2002/0036326 A1 * | 3/2002 | DeJong et al. | 257/369 |
| 2004/0183569 A1 * | 9/2004 | Choe | 326/95 |
| 2005/0006706 A1 * | 1/2005 | Stefanov et al. | 257/368 |
| 2005/0200622 A1 | 9/2005 | Yajima | |
| 2006/0267679 A1 * | 11/2006 | Maekawa | 327/561 |
| 2008/0252372 A1 * | 10/2008 | Williams | 330/251 |
| 2009/0179876 A1 * | 7/2009 | Song et al. | 345/204 |
| 2010/0033463 A1 * | 2/2010 | Nishimura et al. | 345/211 |
| 2010/0253433 A1 * | 10/2010 | Velasquez | 330/257 |

FOREIGN PATENT DOCUMENTS

| | | |
|---|---|---|
| JP | 2005-136322 | 6/1993 |
| JP | 7-235844 | 9/1995 |
| JP | 2005-261129 | 9/2005 |

* cited by examiner

*Primary Examiner* — Fernando L Toledo
*Assistant Examiner* — Mohammed Shamsuzzaman
(74) *Attorney, Agent, or Firm* — Onello & Mello, LLP (57) ABSTRACT

A semiconductor integrated circuit device includes: a substrate which has a first conductivity type and in which a first amplifier area and a second amplifier area are defined; a first well which has a second conductivity type, a first pocket well which has the first conductivity type and is separated from the first well, and a first deep well which has the second conductivity type, surrounds the first pocket well, and is separated from the first well; and a second well which has the second conductivity type, a second pocket well which has the first conductivity type and is separated from the second well, and a second deep well which has the second conductivity type, surrounds the second pocket well, and is separated from the second well The first well, the first pocket well, and the first deep well are formed in the first amplifier area of the substrate, and the second well, the second pocket well, and the second deep well are formed in the second amplifier area of the substrate.

21 Claims, 8 Drawing Sheets

SEMICONDUCTOR INTEGRATED CIRCUIT DEVICE

This application claims priority from Korean Patent Application No. 10-2010-0037547 filed on Apr. 22, 2010 in the Korean Intellectual Property Office, the entire contents of which are incorporated herein by reference.

BACKGROUND

1. Field of the Invention

The present inventive concept relates to a semiconductor integrated circuit (IC) device, and more particularly, to a semiconductor (IC) device including a rail amplifier.

2. Description of the Related Art

As display devices are being developed with increasingly larger screen sizes, the demand for display driver ICs (DDI) is increasing. To suppress an increase in heat generation of DDI chips, split rail amplifiers have been increasingly used as amplifier structures.

In a DDI employing a split rail amplifier, an n-channel metal oxide semiconductor (NMOS) transistor is formed in a P-type pocket well.

To form the NMOS transistor in the P-type pocket well in the DDI employing the split rail amplifier, a punch-through breakdown voltage between the P-type pocket well and a P-type substrate and a junction breakdown voltage between an N-type well and the P-type substrate must be simultaneously secured in a stable manner.

SUMMARY

Aspects of the present inventive concept provide a semiconductor integrated circuit device including a rail amplifier which can simultaneously secure a breakdown voltage between each well and a substrate in a stable manner.

According to one aspect, the inventive concept is directed to a semiconductor integrated circuit device comprising: a substrate which has a first conductivity type and in which a first amplifier area and a second amplifier area are defined; a first well which has a second conductivity type, a first pocket well which has the first conductivity type and is separated from the first well, and a first deep well which has the second conductivity type, surrounds the first pocket well, and is separated from the first well; and a second well which has the second conductivity type, a second pocket well which has the first conductivity type and is separated from the second well, and a second deep well which has the second conductivity type, surrounds the second pocket well, and is separated from the second well. The first well, the first pocket well, and the first deep well are formed in the first amplifier area of the substrate, and the second well, the second pocket well, and the second deep well are formed in the second amplifier area of the substrate.

In one embodiment, the first well and the second well are directly surrounded by the substrate.

In one embodiment, different voltages are applied to the first deep well and the first well.

In one embodiment, a voltage applied to the first deep well is lower than a voltage applied to the first well.

In one embodiment, a power supply voltage is applied to the first well, and a median of the power supply voltage is applied to the first deep well.

In one embodiment, a voltage applied to the first pocket well is the same as the voltage applied to the first deep well.

In one embodiment, a voltage applied to the second well is the same as the voltage applied to each of the first deep well and the first pocket well.

In one embodiment, a ground voltage is applied to each of the substrate, the second deep well, and the second pocket well.

In one embodiment, a power supply voltage is applied to the first well, and a ground voltage is applied to each of the first deep well and the first pocket well.

In one embodiment, the same voltage is applied to each of the first well and the second well.

In one embodiment, the first conductivity type is P-type, and the second conductivity type is N-type.

In one embodiment, the semiconductor integrated circuit device further comprises a p-channel metal oxide semiconductor (PMOS) transistor which is formed on each of the first well and the second well and an n-channel metal oxide semiconductor (NMOS) transistor which is formed on each of the first pocket well and the second pocket well.

According to another aspect, the inventive concept is directed to a semiconductor integrated circuit device comprising: a P-type substrate; an N-type first well which is formed in the substrate; an N-type first deep well which is electrically insulated from the N-type first well; a P-type first pocket well which is formed in the N-type first deep well; and a first NMOS transistor which is formed in the P-type first pocket well. Different voltages are applied to the N-type first well and the N-type first deep well.

In one embodiment, the N-type first well directly contacts the substrate.

In one embodiment, a voltage applied to the P-type first pocket well is the same as a voltage applied to the N-type first deep well.

In one embodiment, a power supply voltage is applied to the N-type first well, and a median of the power supply voltage is applied to each of the P-type first pocket well and the N-type first deep well.

In one embodiment, a first amplifier area and a second amplifier area are defined in the substrate, and the N-type first well, the N-type first deep well, and the P-type first pocket well are formed in the first amplifier area.

In one embodiment, the semiconductor integrated circuit device further comprises: an N-type second well which is formed in the substrate; an N-type second deep well which is electrically insulated from the N-type second well; a P-type second pocket well which is formed in the N-type second deep well; and a second NMOS transistor which is formed in the P-type second pocket well. The N-type second well, the N-type second deep well, and the P-type second pocket well are formed in the second amplifier region of the substrate.

In one embodiment, the median of the power supply voltage is applied to the second well, and a ground voltage is applied to each of the second deep well and the second pocket well.

In one embodiment, the power supply voltage is applied to the N-type first well, and the ground voltage is applied to each of the P-type first pocket well and the N-type first deep well.

According to another aspect, the inventive concept is directed to an integrated amplifier circuit, comprising: a substrate having a first conductivity type, the substrate having a first amplifier region and a second amplifier region; a first well having a second conductivity type, a first pocket well having the first conductivity type, and a first deep well having the second conductivity type, the first deep well surrounding the first pocket well and being separated from the first well; and a second well having the second conductivity type, a second pocket well having the first conductivity type, and a second deep well having the second conductivity type, the second deep well surrounding the second pocket well and being separated from the first well. The first well, the first pocket well, and the first deep well are formed in the first amplifier area of the substrate. The second well, the second pocket well, and the second deep well are formed in the second amplifier region. The amplifier circuit is configured to operate in one of first and second modes, the first and second modes being determined based on voltages applied to the amplifier circuit.

In one embodiment, the first mode is a split-rail-amplifier mode.

In one embodiment, the second mode is a rail-to-rail-amplifier mode.

In one embodiment, in the first mode, a power supply voltage is applied to the first well, and a median of the power supply voltage is applied to the first deep well. In one embodiment, in the first mode, a ground voltage is applied to the second deep well and the second pocket well.

In one embodiment, in the second mode, a power supply voltage is applied to the first well, and a ground voltage is applied to the first deep well and the first pocket well.

In one embodiment, the first conductivity type is P-type, and the second conductivity type is N-type.

In one embodiment, the integrated amplifier circuit further comprises a p-channel metal oxide semiconductor (PMOS) transistor which is formed on each of the first well and the second well and an n-channel metal oxide semiconductor (NMOS) transistor which is formed on each of the first pocket well and the second pocket well.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Advantages and features of the present inventive concept and methods of accomplishing the same may be understood more readily by reference to the following detailed description of exemplary embodiments and the accompanying drawings. The present inventive concept may, however, be embodied in many different forms and should not be construed as being limited to the embodiments set forth herein. Rather, these embodiments are provided so that this description will be thorough and complete and will fully convey the inventive concept to those skilled in the art, and the present inventive concept will only be defined by the appended claims. In the drawings, sizes and relative sizes of layers and regions may be exaggerated for clarity.

As used herein, the singular forms "a", "an" and "the" are intended to include the plural forms as well, unless the context clearly indicates otherwise. It will be further understood that the terms "comprises" and/or "includes" and/or "made of," when used in this specification, specify the presence of stated components, steps, operations, and/or elements, but do not preclude the presence or addition of one or more other components, steps, operations, elements, and/or groups thereof.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element's or feature's relationship to another element(s) or feature(s) as illustrated in the figures. It will be understood that the spatially relative terms are intended to encompass different orientations of the device in use or operation, in addition to the orientation depicted in the figures.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Figure 1:
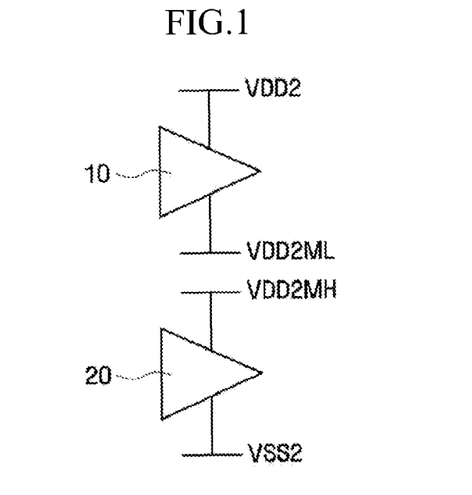
FIG. 1 is a schematic diagram of a split rail amplifier included in a semiconductor integrated circuit device, according to an exemplary embodiment of the present inventive concept.

FIG. 1 is a schematic diagram of a split rail amplifier included in a semiconductor integrated circuit device according to an exemplary embodiment of the present inventive concept.

Referring to FIG. 1, the split rail amplifier includes a first amplifier 10 and a second amplifier 20. A power supply voltage VDD2 and a median VDD2ML of the power supply voltage VDD2 are applied to the first amplifier 10, and a median VDD2MH of the power supply voltage VDD2 and a ground voltage VSS2 are applied to the second amplifier 20. The first amplifier 10 is referred to herein as a high-part amplifier, and the second amplifier 20 is referred to herein as a low-part amplifier. A voltage applied to each of the first amplifier 10 and the second amplifier 20 in the split rail amplifier has a value corresponding to half the difference between the power supply voltage VDD2 and the ground voltage VSS2. Since the use of the split rail amplifier reduces a voltage applied to each amplifier, current consumption and heat generation can be reduced.

Figure 2:
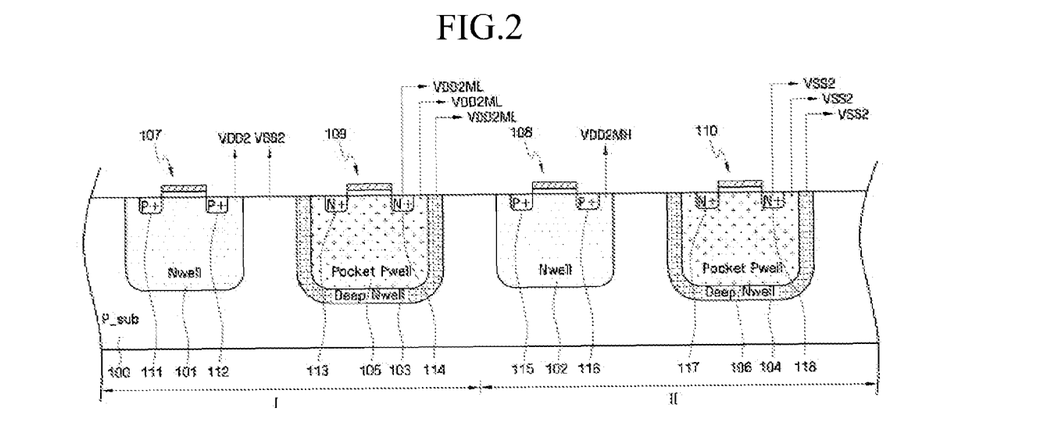
FIG. 2 is a schematic cross-sectional view of a semiconductor integrated circuit device including the split rail amplifier of FIG. 1, according to an exemplary embodiment of the present inventive concept.

FIG. 2 is a schematic cross-sectional view of a semiconductor integrated circuit device including the split rail amplifier of FIG. 1 according to an exemplary embodiment of the present inventive concept.

Referring to FIG. 2, a first amplifier area I and a second amplifier area II are defined in a substrate 100. In FIG. 2, a high-part amplifier is formed in the first amplifier area I, and a low-part amplifier is formed in the second amplifier area II.

The substrate 100 may have a first conductivity type, e.g., P type. The substrate 100 may be a silicon substrate, a gallium arsenic substrate, a silicon germanium substrate, a ceramic substrate, a quartz substrate, a glass substrate for displays, or a semiconductor-on-insulator (SOI) substrate.

A first well 101 of a second conductivity type, e.g., N type, a first deep well 103 of the second conductivity type, and a first pocket well 105 of the first conductivity type may be formed in the first amplifier area I of the substrate 100.

The first well 101 and the first pocket well 105 are separated from each other. The first deep well 103 surrounds only the first pocket well 105. That is, the first deep well 103 and the first well 101 are separated from each other by the substrate 100 and are electrically insulated from each other. The first well 101 may directly contact the substrate 100 or may be directly surrounded by the substrate 100.

As in the first amplifier area I, a second well 102 of the second conductivity type, a second deep well 104 of the second conductivity type, and a second pocket well 106 of the first conductivity type may be formed in the second amplifier area II of the substrate 100. The second well 102 and the second pocket well 106 are separated from each other, and the second deep well 104 surrounds only the second pocket well 106. That is, the second deep well 104 and the second well 102 are separated from each other by the substrate 100 and are electrically insulated from each other. The second well 102 may directly contact the substrate 100 or may be directly surrounded by the substrate 100.

A first transistor 107, e.g., a p-channel metal oxide semiconductor (PMOS) transistor, having source and drain regions 111 and 112 of the first conductivity type, may be formed on the first well 101 in the first amplifier area I. In addition, a second transistor 109, e.g., an n-channel metal oxide semiconductor (NMOS) transistor, having source and drain regions 113 and 114 of the second conductivity type, may be formed on the first pocket well 105 in the first amplifier area I.

Likewise, a third transistor 108, e.g., a PMOS transistor, having source and drain regions 115 and 116 of the first conductivity type, may be formed on the second well 102 in the second amplifier area II. In addition, a fourth transistor 110, e.g., an NMOS transistor, having source and drain regions 117 and 118 of the second conductivity type, may be formed on the second pocket well 106 in the second amplifier area II.

A voltage applied to each well of the semiconductor integrated circuit device according to the current exemplary embodiment is in accordance with the following.

The ground voltage VSS2 is applied to the substrate 100. The power supply voltage VDD2 is applied to the first well 101 formed in the first amplifier area I, and the median VDD2ML of the power supply voltage VDD2 is applied to the first pocket well 105 and the source and drain regions 113 and 114 of the second transistor 109. The median VDD2ML of the power supply voltage VDD2, which is applied to the first pocket well 105, is also applied to the first deep well 103.

The median VDD2MH of the power supply voltage VDD2 is applied to the second well 102 formed in the second amplifier area II, and the ground voltage VSS2 is applied to the second pocket well 106 and the source and drain regions 117 and 118 of the fourth transistor 110. The ground voltage VSS2 applied to the second pocket well 106 is also applied to the second deep well 104.

In the semiconductor integrated circuit device according to the current exemplary embodiment, since the first well 101 and the first deep well 103 are separated from each other, different voltages can be applied to the first well 101 and the first deep well 103. In addition, a punch-through breakdown voltage between the first pocket well 105 and the substrate 100 can be increased by applying the same voltage to each of the first pocket well 105 and the first deep well 103.

Furthermore, since the first well 101 directly contacts the substrate 100, a junction breakdown voltage between the first well 101 and the substrate 100 can be increased compared with when the first well 101 is surrounded by a deep well of the same conductivity type as the first well 101. Therefore, in the semiconductor integrated circuit device according to the current exemplary embodiment, the punch-through breakdown voltage between the first pocket well 105 and the substrate 100 and the junction breakdown voltage between the first well 101 and the substrate 100 can be increased simultaneously.

Figure 3:
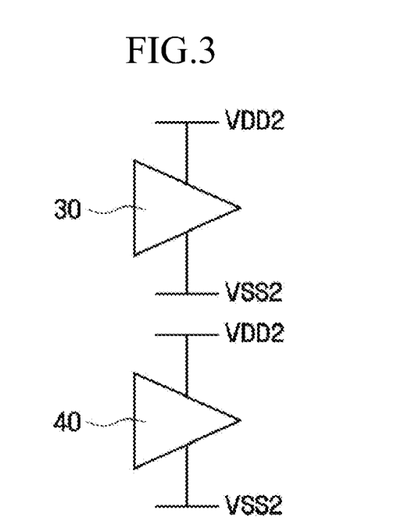
FIG. 3 is a schematic diagram of a rail-to-rail amplifier included in a semiconductor integrated circuit device, according to another exemplary embodiment of the present inventive concept.

FIG. 3 is a schematic diagram of a rail-to-rail amplifier included in a semiconductor integrated circuit device according to another exemplary embodiment of the present inventive concept.

Referring to FIG. 3, the rail-to-rail amplifier includes a first amplifier 30 and a second amplifier 40. A power supply voltage VDD2 and a ground voltage VSS2 are applied to each of the first amplifier 30 and the second amplifier 40.

Figure 4:
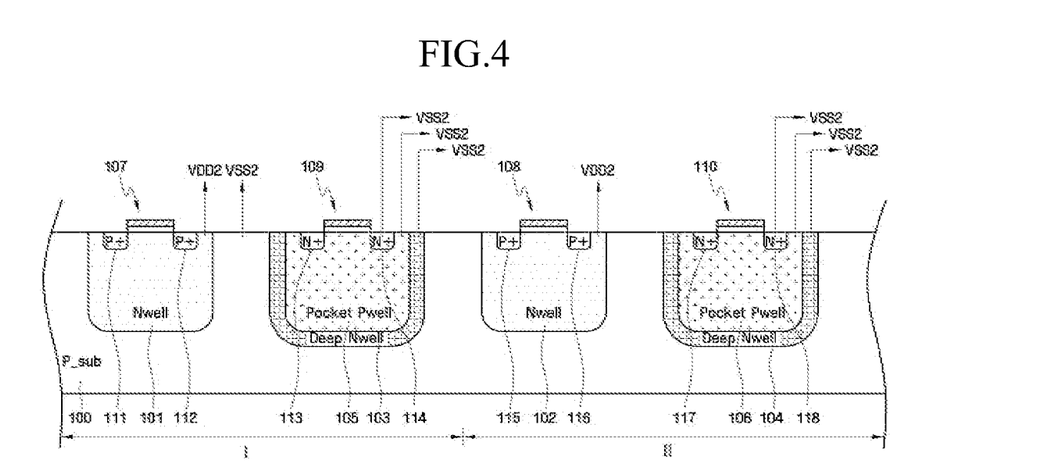
FIG. 4 is a schematic cross-sectional view of a semiconductor integrated circuit device including the rail-to-rail amplifier of FIG. 3, according to another exemplary embodiment of the present inventive concept.

FIG. 4 is a schematic cross-sectional view of a semiconductor integrated circuit device including the rail-to-rail amplifier of FIG. 3 according to another exemplary embodiment of the present inventive concept.

Referring to FIG. 4, the current embodiment is different from the previous embodiment in that the ground voltage VSS2 is applied to a first pocket well 105 and source and drain regions 113 and 114 of a second transistor 109. The ground voltage VSS2 applied to the first pocket well 105 is also applied to a first deep well 103. Also, the power supply voltage VDD2 is applied to a second well 102 formed in a second amplifier area II. As in the previous embodiment, the power supply voltage VDD2 is also applied to the first well 101 formed in the first amplifier area I.

The ground voltage VSS2 is applied to the second pocket well 106 and the source and drain regions 117 and 118 of the fourth transistor 110. The ground voltage VSS2 applied to the second pocket well 106 is also applied to the second deep well 104.

In the semiconductor integrated circuit device according to the current exemplary embodiment, since a first well 101 and the first deep well 103 are also separated from each other, different voltages can be applied to the first well 101 and the first deep well 103. In addition, a punch-through breakdown voltage between the first pocket well 105 and a substrate 100 can be increased by applying the same voltage to each of the first pocket well 105 and the first deep well 103.

Furthermore, since the first well 101 directly contacts the substrate 100, a junction breakdown voltage between the first well 101 and the substrate 100 can be increased compared with when the first well 101 is surrounded by a deep well of the same conductivity type as the first well 101. Therefore, in the semiconductor integrated circuit device according to the current exemplary embodiment, the punch-through breakdown voltage between the first pocket well 105 and the substrate 100 and the junction breakdown voltage between the first well 101 and the substrate 100 can be increased simultaneously.

It can be understood from FIGS. 1 through 4 that the present inventive concept is applicable to a device having an amplifier which includes either or both of the split-rail amplifier and the rail-to-rail amplifier. That is, the device can use the split-rail amplifier or the rail-to-rail amplifier by selecting voltages applied to the first deep well 103, the first pocket well 105, and the second well 102. That is, the device of the inventive concept is operable in one of at least two modes, with the mode being selected based on the voltages applied to the device. Specifically, the device of the inventive concept can be operable in a first mode, e.g., a split-rail-amplifier mode, or a second mode, e.g., a rail-to-rail-amplifier mode, depending on the voltages applied to the device, as described above in detail.

Hereinafter, methods of manufacturing a semiconductor integrated circuit device according to exemplary embodiments of the present inventive concept will be described with reference to FIGS. 5A through 10B.

Figure 5A:
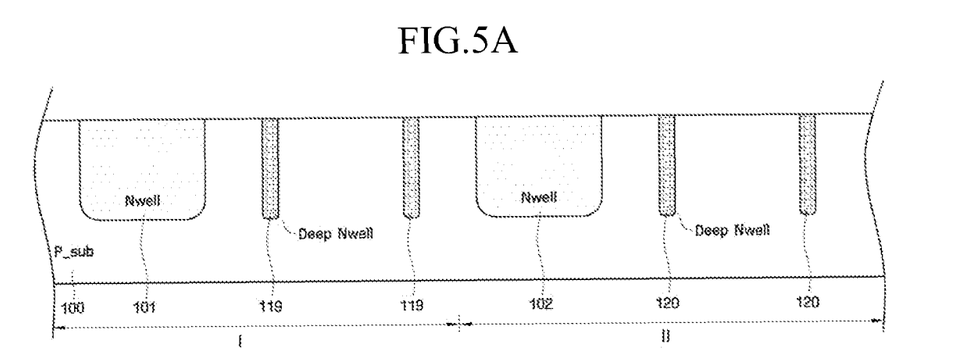
FIGS. 5A, 6A, and 7A are schematic cross-sectional views illustrating a method of manufacturing a semiconductor integrated circuit device according to an exemplary embodiment of the present inventive concept.
Figure 5B:
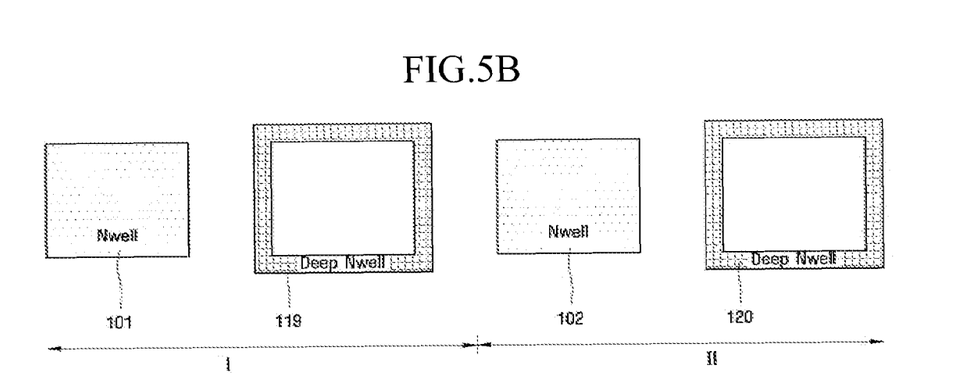
FIGS. 5B, 6B, and 7B are schematic plan views of FIGS. 5A, 6A, and 7A, respectively.
Figure 6A:
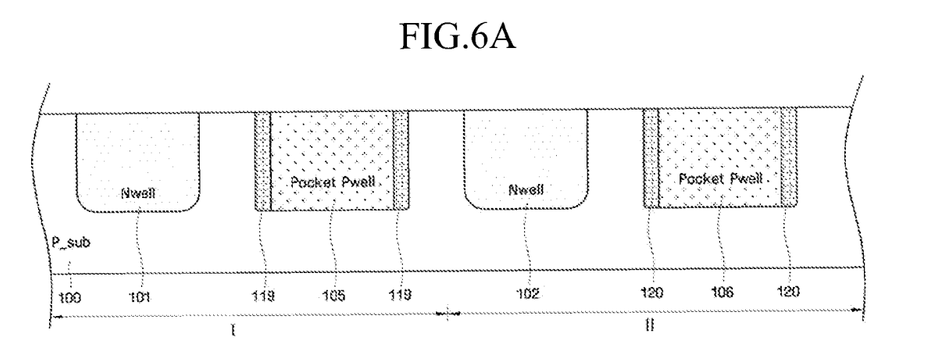
Figure 6B:
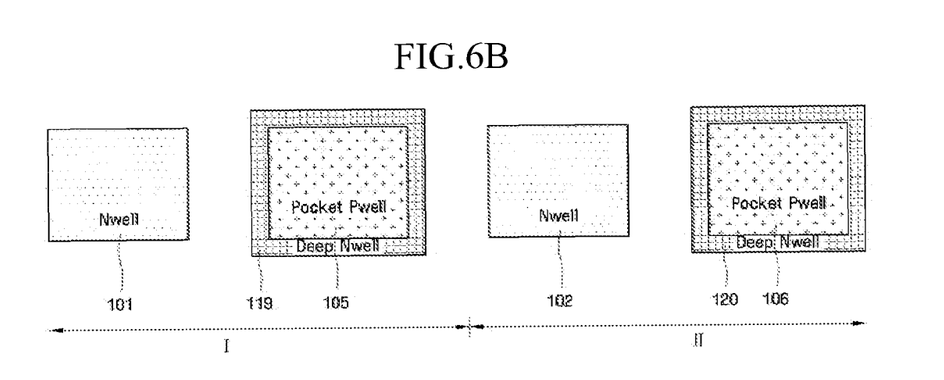
Figure 7A:
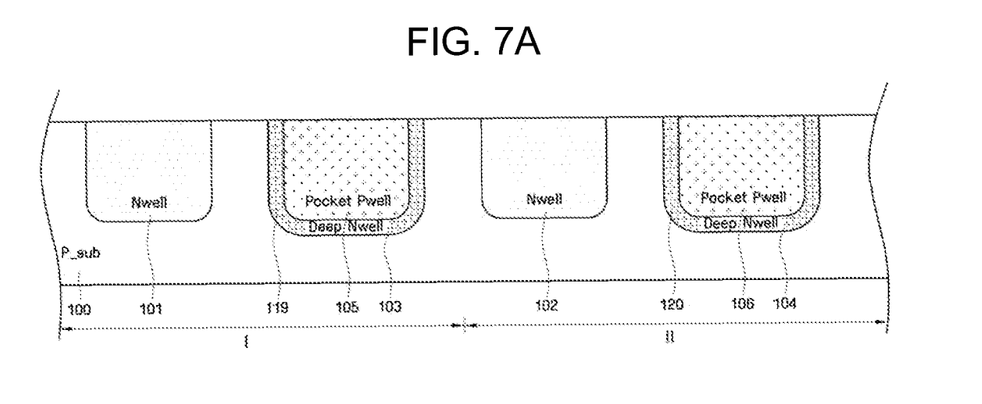
Figure 7B:
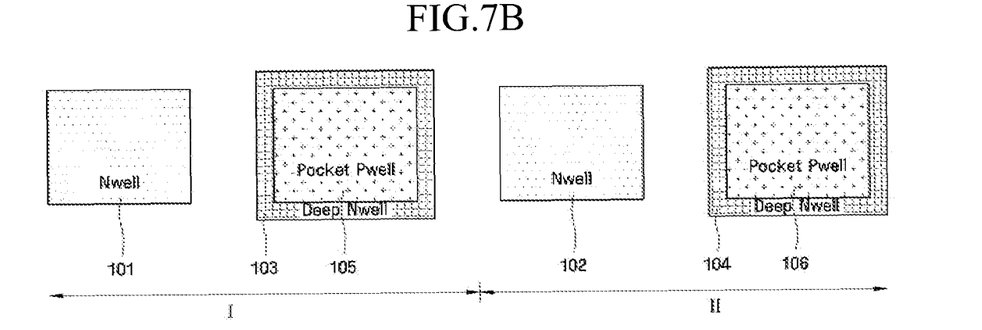

FIGS. 5A, 6A, and 7A are schematic cross-sectional views illustrating a method of manufacturing a semiconductor integrated circuit device according to an exemplary embodiment of the present inventive concept. FIGS. 5B, 6B, and 7B are plan views of FIGS. 5A, 6A, and 7A, respectively.

Referring to FIGS. 2, 5A, and 5B, a predetermined region of a first amplifier area I and a predetermined region of a second amplifier area II in a substrate 100 of a first conductivity type, e.g., P type, are doped with impurities of a second conductivity type, e.g., N type, to form a first well 101 of the second conductivity type and a second well 102 of the second conductivity type, respectively.

Sidewalls 119 of a first deep well 103 and sidewalls 120 of a second deep well 104 may be simultaneously formed on sidewalls of regions in which a first pocket well 105 of the first conductivity type and a second pocket well 106 of the first conductivity type are to be formed. The sidewalls 119 of the first deep well 103 and the sidewalls 120 of the second deep well 104 are separated from the first well 101 and the second well 102, respectively.

Referring to FIGS. 6A and 6B, the regions defined respectively by the sidewalls 119 of the first deep well 103 and the sidewalls 120 of the second deep well 104 are doped with impurities of the first conductivity type, e.g., P type, thereby forming the first pocket well 105 of the first conductivity type and the second pocket well 106 of the first conductivity type.

Then, referring to FIGS. 7A and 7B, impurities of the second conductivity type are implanted to a depth deeper than bottom surfaces of the first and second pocket wells 105 and 106. As a result, a region which surrounds the bottom surface of the first pocket well 105 and is connected to the sidewalls 119 of the first deep well 103 is formed in the first amplifier area I, thereby completing the first deep well 103 of the second conductivity type. In addition, a region which surrounds the bottom surface of the second pocket well 106 and is connected to the sidewalls 120 of the second deep well 104 is formed in the second amplifier area II, thereby completing the second deep well 104 of the second conductivity type.

Next, referring to FIGS. 2 and 4, wiring (not shown) for applying a voltage to each well is formed, and a voltage is applied to each well using the wiring.

In the method of manufacturing the semiconductor integrated circuit device according to the current exemplary embodiment, the sidewalls 119 and 120 of the first and second deep wells 103 and 104 are formed before the bottom surfaces thereof.

Figure 8A:
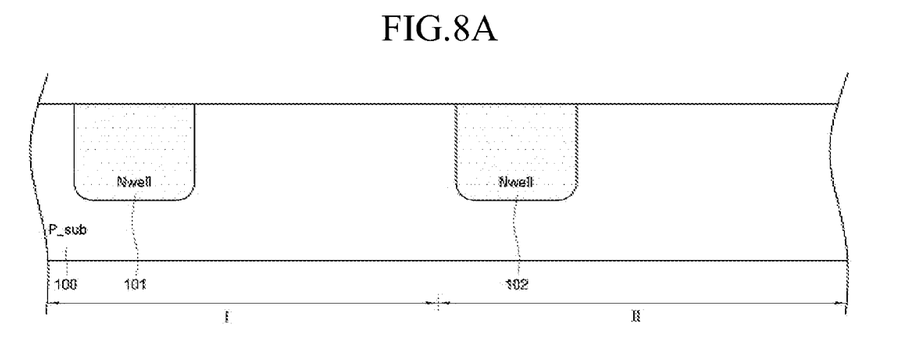
FIGS. 8A, 9A, and 10A are schematic cross-sectional views illustrating a method of manufacturing a semiconductor integrated circuit device according to another exemplary embodiment of the present inventive concept.
Figure 8B:
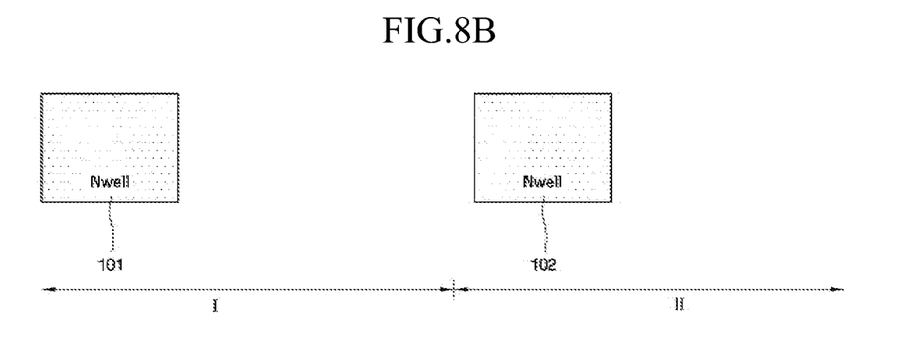
FIGS. 8B, 9B, and 10B are schematic plan views of FIGS. 8A, 9A, and 10A, respectively.
Figure 9A:
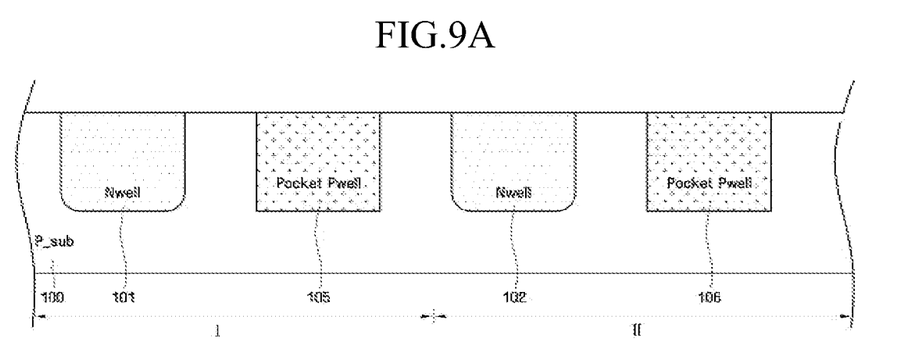
Figure 9B:
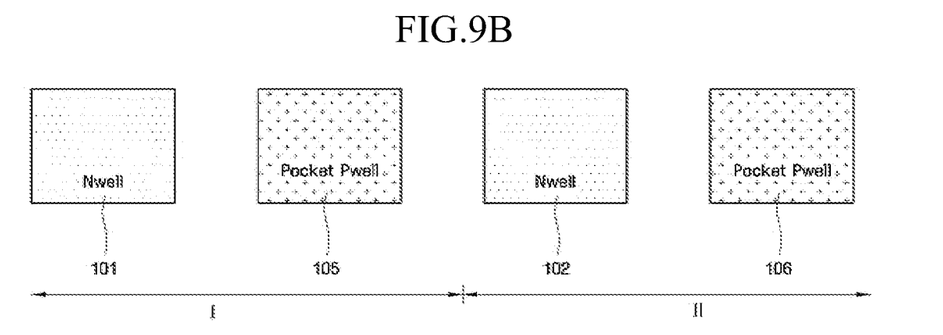
Figure 10A:
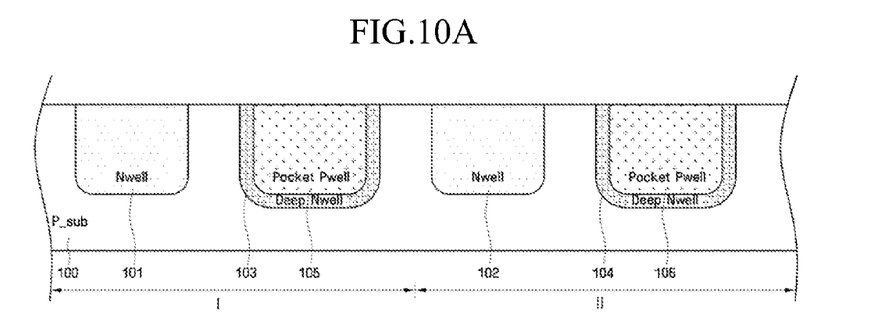
Figure 10B:
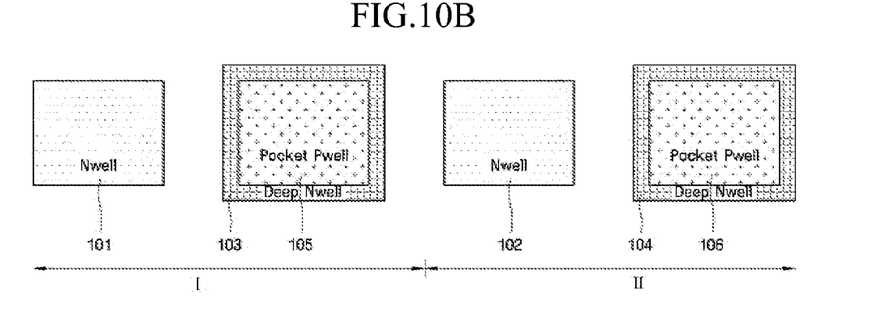

FIGS. 8A, 9A, and 10A are schematic cross-sectional views illustrating a method of manufacturing a semiconductor integrated circuit device according to another exemplary embodiment of the present inventive concept. FIGS. 8B, 9B, and 10B are plan views of FIGS. 8A, 9A, and 10A, respectively.

Referring to FIGS. 8A and 8B, a predetermined region of a first amplifier area I and a predetermined region of a second amplifier area II in a substrate 100 of a first conductivity type, e.g., P type, are doped with impurities of a second conductivity type, e.g., N type, to form a first well 101 of the second conductivity type and a second well 102 of the second conductivity type, respectively.

Then, referring to FIGS. 9A and 9B, a predetermined region of the first amplifier area I and a predetermined region of the second amplifier area II are doped with impurities of the first conductivity type, e.g., P type, to form a first pocket well 105 and a second pocket well 106. The first pocket well 105 is separated from the first well 101, and the second pocket well 106 is separated from the second well 102.

Next, referring to FIGS. 10A and 10B, a region adjacent to sidewalls of the first pocket well 105 and a region adjacent to sidewalls of the second pocket well 106 are doped with impurities of the second conductivity type, e.g., N type, thereby forming a first deep well 103 of the second conductivity type and a second deep well 104 of the second conductivity type. Here, the impurities of the second conductivity type are implanted to a depth deeper than bottom surfaces of the first pocket well 105 and the second pocket well 106. The first deep well 103 surrounds the sidewalls and bottom surface of the first pocket well 105, and the second deep well 104 surrounds the sidewalls and bottom surface of the second pocket well 106.

Referring to FIGS. 2 and 4, wiring (not shown) for applying a voltage to each well is formed, and a voltage is applied to each well using the wiring.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A semiconductor integrated circuit device comprising:
a substrate of a first conductivity type in which a first amplifier area and a second amplifier area are defined for a pair of amplifiers;
a first well of a second conductivity type, a first pocket well of the first conductivity type that is electrically separated from the first well, and a first deep well of the second conductivity type, which surrounds the first pocket well and is adjacent to but electrically separated from the first well; and
a second well of the second conductivity type, a second pocket well of the first conductivity type that is electrically separated from the second well, and a second deep well of the second conductivity type, which surrounds the second pocket well, and is adjacent to but electrically separated from the second well,
wherein the first well, the first pocket well, and the first deep well are formed in the first amplifier area of the substrate, and the second well, the second pocket well, and the second deep well are formed in the second amplifier area of the substrate, and
wherein the second well is connected to a high median power supply circuit potential and each of the first deep well and the first pocket well are connected to a low median power supply circuit potential.

2. The semiconductor integrated circuit device of claim 1, wherein the first well and the second well are directly surrounded by the substrate.

3. The semiconductor integrated circuit device of claim 2, wherein the first deep well and the first well are connected to different circuit potentials.

4. The semiconductor integrated circuit device of claim 3, wherein the first deep well is connected to a lower circuit potential than the first well is connected to.

5. The semiconductor integrated circuit device of claim 4, wherein the first well is connected to a power supply circuit potential, and the first deep well is connected to a low median of the power supply circuit potential.

6. The semiconductor integrated circuit device of claim 5, wherein the first pocket well is connected to the same circuit potential as the first deep well.

7. The semiconductor integrated circuit device of claim 11, wherein each of the substrate, the second deep well, and the second pocket well are connected to a circuit ground potential.

8. The semiconductor integrated circuit device of claim 1, wherein the first conductivity type is P-type, and the second conductivity type is N-type.

9. The semiconductor integrated circuit device of claim 1, further comprising a p-channel metal oxide semiconductor (PMOS) transistor which is formed on each of the first well and the second well and an n-channel metal oxide semiconductor (NMOS) transistor which is formed on each of the first pocket well and the second pocket well.

10. A semiconductor integrated circuit device comprising:
a P-type substrate;
a first amplifier area defined in the substrate including:
an N-type first well formed in the substrate;
an N-type first deep well formed in the substrate and electrically isolated from the N-type first well;
a P-type first pocket well formed in the N-type first deep well;
a first NMOS transistor formed in the P-type first pocket well,
wherein the N-type first well and the N-type first deep well are connected to different circuit potentials and the N-type first deep well and P-type first pocket well are connected to the same circuit potentials; and
a second amplifier area defined in the substrate including:
an N-type second well formed in the substrate;
an N-type second deep well formed in the substrate and electrically isolated from the N-type second well;
a P-type second pocket well formed in the N-type second deep well and
a second NMOS transistor formed in the P-type second pocket well;
wherein the N-type second well and the N-type second deep well are connected to different circuit potentials and the N-type second deep well and P-type second pocket well and connected to the same circuit potentials.

11. The semiconductor integrated circuit device of claim 10, wherein the N-type first well directly contacts the substrate.

12. The semiconductor integrated circuit device of claim 10, wherein the N-type first well is connected to a power supply circuit potential, and the P-type first pocket well and the N-type first deep well are connected to a low median power supply circuit potential.

13. The semiconductor integrated circuit device of claim 12, wherein the second well is connected to a high median power supply circuit potential, and the second deep well and the second pocket well are connected to a ground supply circuit potential.

14. An integrated amplifier circuit, comprising:
a substrate having a first conductivity type, the substrate having a first amplifier region and a second amplifier region for a pair of amplifiers;
a first well having a second conductivity type, a first pocket well having the first conductivity type, and a first deep well having the second conductivity type, the first deep well surrounding the first pocket well and being separated from the first well; and
a second well having the second conductivity type, a second pocket well having the first conductivity type, and a second deep well having the second conductivity type, the second deep well surrounding the second pocket well and being separated from the second well; wherein:
the first well, the first pocket well, and the first deep well are formed in the first amplifier area of the substrate;
the second well, the second pocket well, and the second deep well are formed in the second amplifier region;
the amplifier circuit is configured to respond to applied voltages by operating in one of first and second modes, and
a p-channel metal oxide semiconductor (PMOS) transistor which is formed on each of the first well and the second well and an n-channel metal oxide semiconductor (NMOS) transistor which is formed on each of the first pocket well and the second pocket well.

15. The integrated amplifier circuit of claim 14, wherein the first mode is a split-rail-amplifier mode.

16. The integrated amplifier circuit of claim 15, wherein the second mode is a rail-to-rail-amplifier mode.

17. The integrated amplifier circuit of claim 14, wherein, in the first mode, a power supply voltage is applied to the first well, and a low median of the power supply voltage is applied to the first deep well.

18. The integrated amplifier circuit of claim 17, wherein, in the first mode, a ground voltage is applied to the second deep well and the second pocket well.

19. The integrated amplifier circuit of claim 14, wherein, in the second mode, a power supply voltage is applied to the first well, and a ground voltage is applied to the first deep well and the first pocket well.

20. The integrated amplifier circuit of claim 19, wherein the same voltage is applied to each of the first well and the second well.

21. The integrated amplifier circuit of claim 14, wherein the first conductivity type is P-type, and the second conductivity type is N-type.

\* \* \* \* \*